US012463009B2

(12) United States Patent
Bischoff et al.

(10) Patent No.: US 12,463,009 B2
(45) Date of Patent: Nov. 4, 2025

(54) METHOD AND SYSTEM FOR STUDYING SAMPLES USING A SCANNING TRANSMISSION CHARGED PARTICLE MICROSCOPE WITH REDUCED BEAM INDUCED SAMPLE DAMAGE

(71) Applicant: FEI Company, Hillsboro, OR (US)

(72) Inventors: Maarten Bischoff, Eindhoven (NL); Bert Freitag, Eindhoven (NL)

(73) Assignee: FEI Company, Hillsboro, OR (US)

( * ) Notice: Subject to any disclaimer, the term of this patent is extended or adjusted under 35 U.S.C. 154(b) by 512 days.

(21) Appl. No.: 17/853,727

(22) Filed: Jun. 29, 2022

(65) Prior Publication Data

US 2023/0005710 A1 Jan. 5, 2023

(30) Foreign Application Priority Data

Jun. 30, 2021 (EP) .................................... 21182936

(51) Int. Cl.

*H01J 37/28* (2006.01)
*H01J 37/20* (2006.01)
*H01J 37/26* (2006.01)

(52) U.S. Cl.

CPC .............. *H01J 37/28* (2013.01); *H01J 37/20* (2013.01); *H01J 37/265* (2013.01); *H01J 2237/2802* (2013.01)

(58) Field of Classification Search

CPC .......... H01J 37/28; H01J 37/20; H01J 37/265; H01J 2237/2802

See application file for complete search history.

(56) References Cited

U.S. PATENT DOCUMENTS

2007/0181807 A1* 8/2007 Fukuda ................. H01J 37/263 250/310
2013/0105689 A1* 5/2013 Bischoff ................. H01J 37/22 250/307
2017/0154754 A1* 6/2017 Dahmen ................. H01J 37/10
2022/0084783 A1* 3/2022 Yagi .................... H01J 37/1477
2022/0247934 A1* 8/2022 Walden, II .............. H01J 37/20

FOREIGN PATENT DOCUMENTS

DE 69634461 1/2006
EP 3518270 7/2019
EP 3764164 A1 * 1/2021 ......... G03F 7/70483

OTHER PUBLICATIONS

European Search Report for EP 21182936, issued Jan. 4, 2022.

* cited by examiner

*Primary Examiner* — David E Smith

(57) ABSTRACT

The disclosure relates to a method for examining a sample in a scanning transmission charged particle microscope. The method comprises the steps of providing a scanning transmission charged particle microscope, having an illuminator and a scanning unit. The method comprises the steps of providing a desired dose for at least a first sample location of the plurality of sample locations; and determining, using a controller of the microscope, a first set of parameter settings for the illuminator and the scanning unit for substantially achieving the desired dose at the first sample location.

16 Claims, 4 Drawing Sheets

METHOD AND SYSTEM FOR STUDYING SAMPLES USING A SCANNING TRANSMISSION CHARGED PARTICLE MICROSCOPE WITH REDUCED BEAM INDUCED SAMPLE DAMAGE

FIELD OF THE INVENTION

The disclosure relates to method and system for examining a sample in a scanning transmission charged particle microscope.

BACKGROUND

Charged-particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" apparatus (e.g. a FIB-SEM), which additionally employ a "machining" Focused Ion Beam (FIB), allowing supportive activities such as ion-beam milling or Ion-Beam-Induced Deposition (IBID), for example.

In STEM, irradiation of a sample by a scanning electron beam leads to interaction between the primary electrons and the sample. The interaction may lead to elastically scattered electrons exiting the sample, which may be detected to form a microscopic image. Additionally, irradiation of the sample precipitates emanation of "auxiliary" radiation from the sample, in the form of secondary electrons, backscattered electrons, X-rays and cathodoluminescence (infrared, visible and/or ultraviolet photons). One or more components of this emanating radiation may be detected and used for making microscope images.

Material scientists have been using electron microscopes at large acceleration voltages (e.g. 200 kV or 300 kV) in order to reach sub 1A resolution on relatively thick samples. These high energy electrons limit the range of materials that can be studied with high resolution and without damage. Sub Angstrom Low Voltage Electron Microscopy (at 60 kV or at an even lower acceleration voltage) provides reduced acceleration voltages that minimizes beam-induced damage due to knock-on damage, thus improving the range of materials that can be studied with sub 1 Å resolution. Examples are 2D materials like graphene and MoS2, or MOFs (metal-organic frameworks). However, other damage mechanisms can increase at these lower acceleration voltages, for example ionization damage and beam-induced etching. Thus, imaging conditions need to be optimized per specimen, and this requires expert users as these imaging conditions are not easy to control and often not reproducible. Changing the acceleration voltage, for example, reduces the knock-on damage, but potentially gives hours of drift and needs a lot of retuning.

With the above in mind, it is an object to provide a method and system that minimizes beam-induced damage on beam-sensitive samples when studied in scanning charged particle microscopy, such as HRSTEM, for example. Particularly, it is an object to provide a method and system that allows non-expert users to successfully achieve these results on beam-sensitive samples.

BRIEF DESCRIPTION OF THE DRAWINGS

In the Figures, where pertinent, corresponding parts are indicated using corresponding reference symbols. It should be noted that, in general, the Figures are not to scale.

DETAILED DESCRIPTION

Figure 1:
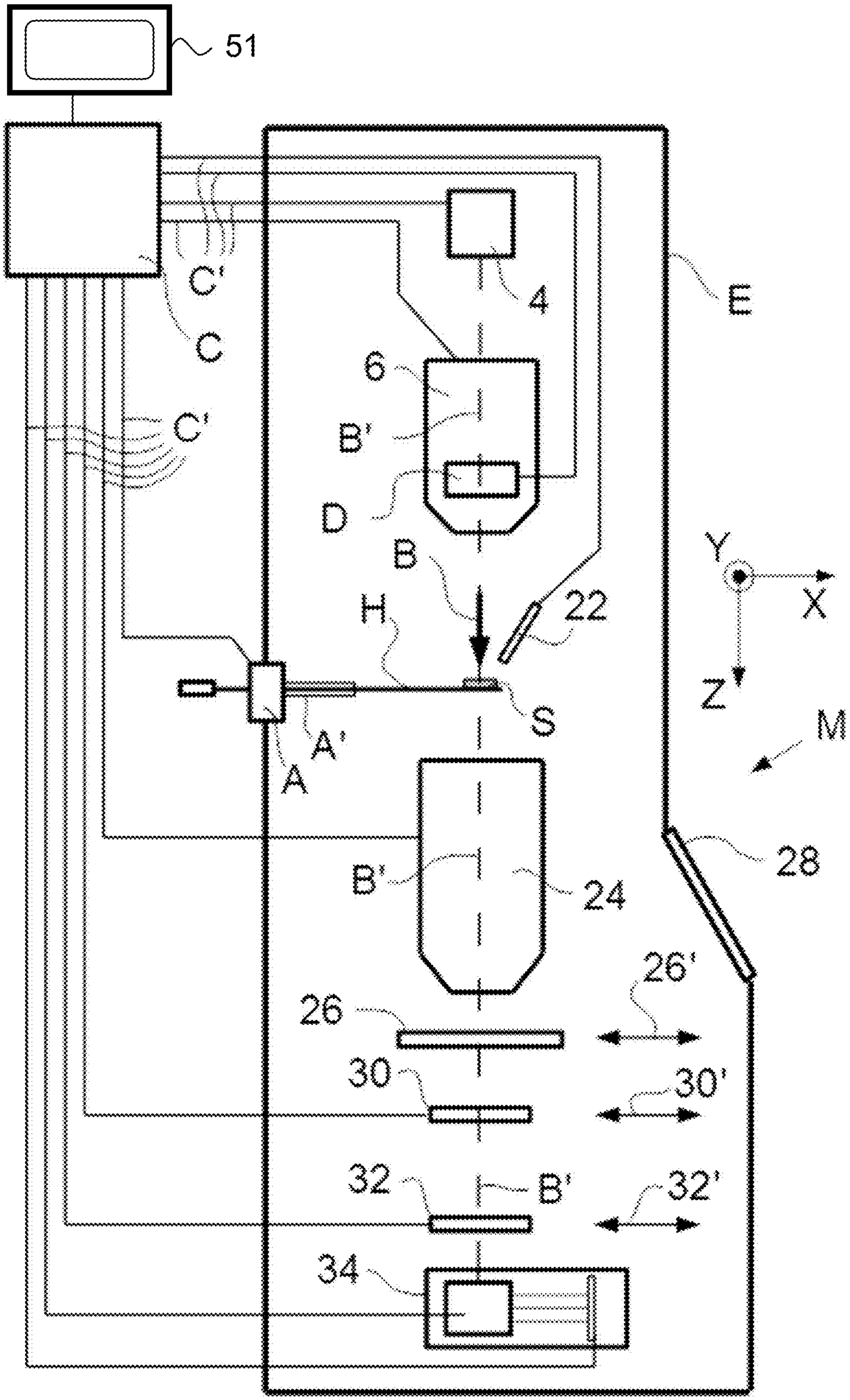
FIG. 1 shows a longitudinal cross-sectional view of a charged-particle microscope.

To this end, the disclosure provides a method for examining a sample in a scanning transmission charged particle microscope. As described herein, the method comprises the step of providing a scanning transmission charged particle microscope, wherein said scanning transmission charged particle microscope comprises a charged particle beam source for emitting a charged particle beam; a sample holder for holding a sample; an illuminator for directing the charged particle beam emitted from the charged particle source on said sample; a scanning unit for scanning said beam onto a plurality of sample locations on said sample; and a control unit for controlling operations of the scanning transmission charged particle microscope.

As defined herein, the method comprises the step of providing a desired dose parameter for at least a first sample location of said plurality of sample locations. The desired dose parameter may be provided by a user, for example, or by said controller. By providing a desired dose parameter, a direct boundary condition will be applied to the system, allowing more easy control thereof. The desired dose parameter may comprise one or more of a dose, dose-rate and total dose. Hereinafter, the terms desired dose parameter and desired dose will be used interchangeably. It will thus be understood that in locations where the general term "desired dose parameter" or "desired dose" is used, this could refer to a desired dose, a desired dose-rate and/or a desired total dose, unless explicitly stated otherwise.

The method as defined herein further comprises the step of determining, using said controller, a first set of parameter settings for said illuminator and said scanning unit for substantially achieving said desired dose at said first sample location. The controller is arranged for determining the first set of parameter settings as an output, with the desired dose as an input parameter to the controller. It is noted here, that the desired dose can be a beam current at the sample, a dose rate or a total dose, for example.

The method as defined herein provides a dose-controlled workflow for scanning transmission charged particle microscopy, such as, for example, STEM. In particular, the method allows a low dose workflow for STEM and material science applications. It is noted that in present day microscopes the beam current- and thus dose-rate and dose-used in a HRSTEM experiment, for example, is not well known or not very reliably determinable. To come to statistical meaningful data with limited time on the microscope, customers in the industry need to reproduce results on the same and different tools. This means that successful settings need to be identified first, in order for them to be used on the same microscope and between microscopes. Unfortunately, the optical set-up (gun lens setting, spot number, extraction voltages, and apertures, for example) does not allow to reproduce the dose or dose rate in STEM.

The invention as defined herein provides a solution to this as it allows a new handling with a different approach, which enables non-experts in optics to run experiments reproducibly to increase the yield of experiments, and which allows material scientists to model and simulate results quantitatively, for example.

The method as defined herein does this by providing a desired dose and using a controller for determining the settings of the scanning transmission charged particle microscope, in particular settings for at least the illuminator and the scanning unit, to effectuate that desired dose on the sample.

In principle, the controller may determine the settings of the scanning transmission charged particle microscope based on one or more of the following three principles:

1) using a numerical model to calculate the settings of the microscope based on the desired dose as an input parameter;
2) using active measurements of the beam current and modifying settings of the microscope based on the desired dose as an input parameter; and
3) using calibration data of the microscope to determine the settings of the microscope based on the desired dose as an input parameter.

These three principles and advantageous embodiments will be elucidated in further detail below.

According to the first principle a numerical model is used.

The controller may, in an embodiment, be able to determine the first set of parameter settings by using a numerical model of the scanning transmission charged particle microscope and the components thereof. The numerical model of the scanning transmission charged particle microscope may be based, at least partly, on a thick lens model, although other ways of modelling the microscope are conceivable as well.

The use of a numerical model allows the user to change the dose/dose rate without pre-exposing the sample or measuring the current with device. This method, and associated microscope, allows to predict the dose/dose rate with the parameter settings of the illuminator. This is powerful since no electrons are used to damage the sample before a final experiment is run.

The numerical model as defined in this embodiment may use one or more boundary conditions. These boundary conditions may be governed by at least one or more of the following: beam current, dose rate and/or total dose. The boundary condition may, in an embodiment, be set by a user of the microscope. The boundary condition may, additionally or alternatively, be set automatically.

The numerical model may thus determine the settings of the illuminator or parts thereof, such as any condenser lenses for example, for controlling the beam current, dose or dose rate at the sample. Those skilled in the art will be familiar with developing a numerical model for a charged particle device.

The numerical model may comprise aberration and focus as part of the set of parameters. The numerical model may thus include focus, astigmatism and/or coma, and may keep these parameters constant when changing the dose and/or dose rate.

According to the second principle active measurements of the beam current are performed.

The scanning transmission charged particle microscope may comprise a beam current measurement device. This beam current measurement device may be located near the sample, for example, to measure the beam current that the sample receives. Based on the desired beam current, dose rate, or total dose, the controller may determine a first set of parameter settings for the microscope, wherein use is made of the measured beam current. If the desired beam current is equal to the measured beam current, then no further action needs to take place. In other events, the settings of the microscope may be tweaked to come to the desired beam current.

In an embodiment, the beam current measurement device is arranged to measure the beam current upstream of the illuminator. The measured beam current upstream of the illuminator, which may be the beam current at the position of the extractor aperture, for example, can be used as an input parameter for the numerical model. This way, a combination of the first principle (numerical model) and second principle (measuring the beam current) is made.

According to the third principle use is made of pre-recorded calibration data that is stored in a calibration data storage unit, which may be part of the controller, for example.

In this embodiment, where use is made of pre-recorded calibration data, the desired dose can be compared to the pre-recorded calibration data and corresponding resulting doses. Based on the desired dose, the controller is able to select a first set of parameters that will yield that desired dose. Other boundary conditions, such as the acceleration voltage of the microscope, may be provided as well. It is noted that these differences in acceleration voltages may be part of the pre-recorded calibration data as well.

Above, a total of three principles have been explained. It is noted that a combination of using the different principles is conceivable, such as has already been explained by means of the combination of using active measurements within a numerical model. A combination of either one of the principles is conceivable. In any event, further embodiments will be explained below, wherein in principle all further embodiments could make use of either one or more of the discussed principles.

In an embodiment, the method comprises the step of illuminating said sample at said first location using said first set of parameter settings. The method may comprise the step of assessing the resulting dose that was based on the first set of parameters. For example, the resulting dose may be measured (directly or indirectly). Modifications of the first set of parameters may be made, if desired, to effectuate the desired dose.

In an embodiment, the method comprises the steps of providing a second desired dose and determining, using said controller, a second set of parameter settings for said illuminator and said scanning unit for substantially achieving said second desired dose. The second desired dose may differ from the first desired dose. The second desired dose may be intended for the same location on the sample, or for a different location on the sample. Said sample may thus be illuminated at said first location using said second set of parameter settings, and/or said sample may be illuminated at a second location of said plurality of sample locations. The second desired dose may be higher or lower compared to the first desired dose.

In an embodiment, the first set of parameter settings is used for illuminating said sample at said second location.

In an embodiment, the controller is arranged for tracking an accumulated dose effect for said corresponding location. This may, in principle, be any location on the sample that is illuminated, such as the first and/or second location. The accumulated dose can be determined for the areas that have been visited already. When an area is exposed multiple times, this embodiment allows to track and indicate the total accumulated dose. As an example, an image (or map) of the sample may be created and shown to the user. The image or map may include an accumulated dose statistic. When moving to another area this previous area can be graphically marked and the accumulated dose can be indicated. When searching across the sample, the user may be provided with a patchwork of areas that are marked as already visited (exposed with a certain dose). The total dose may be stored in the metadata of the images taken, so that not only the dose and dose rate of the last image but the accumulated dose can be documented as well. This allows a much better reproducibility of experiments by having the total dose documented not only the dose of the last exposure.

In an embodiment, the scanning transmission charged particle microscope comprises a temperature control system that is arranged for controlling the temperature of at least parts of the microscope. The temperature control system may in particular be arranged for controlling the temperature of the microscope when the acceleration voltage changes. The temperature control system may be part of the illuminator, in an embodiment. The temperature control system ensures that aberrations due to thermal expansions are minimized or even prevented. This may minimize or even prevent the drift and retuning required when changing the acceleration voltage.

In an embodiment, the temperature control system comprises so-called full constant power lenses, which are described in EP 1 498 929 B1 in name of applicant, for example. By implementation of full constant power lenses, the total power of the microscope can remain fixed when changing the acceleration voltage, and thus the temperature is controlled. The advantage is that when studying a specimen that is sensitive for knock-on damage, the optimum acceleration voltage can be found during the experiment. In other words, a compromise can be found "on the fly" between best resolution and minimized knock-on damage.

In an embodiment, the method comprises the step of keeping the power of all lenses in the illuminator fixed to a first power setting. It was found that by keeping the power of all lenses fixed when switching the acceleration voltage, the stage drift, beam drift, and focus and astigmatism drift are minimized so that one can continue working almost immediately after the switch.

As an addition or alternative, the temperature control system may comprise a heat exchanger. The heat exchanger may be arranged for increasing heat dissipation when the microscope consumes more power, and vice versa.

In an embodiment, the scanning transmission charged particle microscope comprises a user interface, wherein the user interface is arranged for setting the desired dose. As indicated before, the desired dose can be one or more of the following: beam current, dose rate and/or total dose. The user interface may be a graphical user interface. The user interface allows a user to provide input settings for said first and/or second set of parameter settings, wherein these input settings include, in an embodiment, dose related settings, including at least one of a dose rate, a dose, and a total dose.

In an embodiment, the method comprises the step of changing an acceleration voltage of the scanning transmission charged particle microscope. The change in acceleration voltage may be exerted by a user, for example, or may be part of a set of parameter settings. The first set of parameter settings may thus additionally include settings for said beam source, or any other parts of microscope. The method may comprise the step of determining, using said controller, a resulting dose and/or dose rate, as a result of the provided change in acceleration voltage. This embodiment is powerful to minimize knock on damage effects fast and with minimum dose, in particular in combination with the temperature control system as this system allows a rapid change in acceleration voltage (high tension).

In an embodiment, the method comprises the step of providing a further scanning transmission charged particle microscope. Said further scanning transmission charged particle microscope comprises a respective charged particle beam source for emitting a charged particle beam, a respective sample holder for holding a sample, a respective illuminator for directing the charged particle beam emitted from the charged particle source on said sample, a respective scanning unit for scanning said beam onto a plurality of sample locations on said sample; and a respective control unit for controlling operations of the further scanning transmission charged particle microscope. In this embodiment, the method comprises the step of determining, using said respective controller of said further scanning transmission charged particle microscope, a respective first set of parameter settings for said further scanning transmission charged particle microscope for substantially achieving said desired dose at a sample location. This embodiment allows intratool reproducibility of experiments. When the method as defined herein is performed on at least two microscopes, it not only allows to reproduce experiments and predict dose and dose rates on a single tool, but it also allows to reproduce the same dose/dose rates experiments on a second tool. This enables reproducibility of data generation in different locations around the world.

According to an aspect, a scanning transmission charged particle microscope is provided, as defined in claim 13. The microscope comprises a charged particle beam source for emitting a charged particle beam, a sample holder for holding a sample, an illuminator for directing the charged particle beam emitted from the charged particle source onto the sample, and a control unit for controlling operations of the scanning transmission charged particle microscope. The scanning transmission charged particle microscope as defined herein is arranged for:

- Receiving a desired dose for at least a first sample location of said plurality of sample locations; and
- Determining, using said controller, a first set of parameter settings for said illuminator and said scanning unit for substantially achieving said desired dose at said first sample location.

The advantages of such a microscope have already been elucidated based on the method as defined herein.

Further embodiments and advantages thereof are subject to the dependent claims.

The scanning transmission charged particle microscope may comprise a blanker. The blanker may be used to set-up the dose and/or dose rate as part of the illuminator.

FIG. 1 is a highly schematic depiction of an embodiment of a transmission charged particle microscope M, which, in this case, is a TEM/STEM (though, in the context of the present disclosure, it could just as validly be an ion-based or proton microscope, for example). In FIG. 1, within a vacuum enclosure E, an electron source 4 (such as a Schottky emitter, for example) produces a beam (B) of electrons that traverse an electron-optical illuminator 6, serving to direct/focus them onto a chosen part of a sample S (which may, for example, be (locally) thinned/planarized). This illuminator 6 has an electron-optical axis B', and will generally comprise a variety of electrostatic/magnetic lenses, (scan) deflector(s) D, blankers, correctors (such as stigmators), etc.; typically, it can also comprise a condenser system (the whole of item 6 is sometimes referred to as "a condenser system"). The illuminator may be set to a set of parameter settings by applying the parameter settings to one or more components of the illuminator. For example, a particular set of parameter settings may be applied to the illuminator to adjust only the dose, and at the same time keep all other relevant optical settings, such as focus, astigmatism, coma, beam tilt, and image shift, the same.

The sample S is held on a sample holder H. As here illustrated, part of this holder H (inside enclosure E) is mounted in a cradle A' that can be positioned/moved in multiple degrees of freedom by a positioning device (stage) A; for example, the cradle A' may (inter alia) be displaceable in the X, Y and Z directions (see the depicted Cartesian coordinate system), and may be rotated about a longitudinal axis parallel to X. Such movement allows different parts of the sample S to be irradiated/imaged/inspected by the electron beam traveling along axis B' (and/or allows scanning motion to be performed as an alternative to beam scanning [using deflector(s) D], and/or allows selected parts of the sample S to be machined by a (non-depicted) focused ion beam, for example).

The (focused) electron beam B traveling along axis B' will interact with the sample S in such a manner as to cause various types of "stimulated" radiation to emanate from the sample S, including (for example) secondary electrons, backscattered electrons, X-rays and optical radiation (cathodoluminescence). If desired, one or more of these radiation types can be detected with the aid of detector 22, which might be a combined scintillator/photomultiplier or EDX (Energy-Dispersive X-Ray Spectroscopy) module, for instance; in such a case, an image could be constructed using basically the same principle as in a SEM. However, alternatively or supplementally, one can study electrons that traverse (pass through) the sample S, emerge (emanate) from it and continue to propagate (substantially, though generally with some deflection/scattering) along axis B'. Such a transmitted electron flux enters an imaging system (combined objective/projection lens) 24, which will generally comprise a variety of electrostatic/magnetic lenses, deflectors, correctors (such as stigmators), etc.

In normal (non-scanning) TEM mode, this imaging system 24 can focus the transmitted electron flux onto a fluorescent screen 26, which, if desired, can be retracted/withdrawn (as schematically indicated by arrows 26') so as to get it out of the way of axis B'. An image (or diffractogram) of (part of) the sample S will be formed by imaging system 24 on screen 26, and this may be viewed through viewing port 28 located in a suitable part of a wall of enclosure E. The retraction mechanism for screen 26 may, for example, be mechanical and/or electrical in nature, and is not depicted here.

As an alternative to viewing an image on screen 26, one can instead make use of the fact that the depth of focus of the electron flux emerging from imaging system 24 is generally quite large (e.g. of the order of 1 meter). Consequently, various types of sensing device/analysis apparatus can be used downstream of screen 26, such as:

TEM camera 30. At camera 30, the electron flux can form a static image (or diffractogram) that can be processed by controller C and displayed on a display device (not depicted), such as a flat panel display, for example. When not required, camera 30 can be retracted/withdrawn (as schematically indicated by arrows 30') so as to get it out of the way of axis B'.

STEM recorder 32. An output from recorder 32 can be recorded as a function of (X,Y) scanning position of the beam B on the sample S, and an image can be constructed that is a "map" of output from recorder 32 as a function of X,Y. Recorder 32 can comprise a single pixel with a diameter of e.g. 20 mm, as opposed to the matrix of pixels characteristically present in camera 30. Moreover, recorder 32 will generally have a much higher acquisition rate (e.g. $10^6$ points per second) than camera 30 (e.g. $\mathbf{10}^2$ images per second). Once again, when not required, recorder 32 can be retracted/withdrawn (as schematically indicated by arrows 32') so as to get it out of the way of axis B' (although such retraction would not be a necessity in the case of a donut-shaped annular dark field recorder 32, for example; in such a recorder, a central hole would allow beam passage when the recorder was not in use).

As an alternative to imaging using camera 30 or recorder 32, one can also invoke spectroscopic apparatus 34, which could be an EELS module, for example.

It should be noted that the order/location of items 30, 32 and 34 is not strict, and many possible variations are conceivable. For example, spectroscopic apparatus 34 can also be integrated into the imaging system 24.

Note that the controller (which may be a combined controller and processor) C is connected to various illustrated components via control lines (buses) C'. The controller may comprise at least one processor and a non-transitory memory for storing computer readable instructions. The method disclosed herein may be implemented by executing the computer readable instructions in the processor. Controller can be connected to a computer screen 51, which may be provided with a user interface (UI). This controller C can provide a variety of functions, such as synchronizing actions, providing setpoints, processing signals, performing FE2707US1-NAT calculations, and displaying messages/information on a display device (not depicted). It will be understood that the (schematically depicted) controller C may be (partially) inside or outside the enclosure E, and may have a unitary or composite structure, as desired. The skilled artisan will understand that the interior of the enclosure E does not have to be kept at a strict vacuum; for example, in a so-called "Environmental TEM/STEM", a background atmosphere of a given gas is deliberately introduced/maintained within the enclosure E. The skilled artisan will also understand that, in practice, it may be advantageous to confine the volume of enclosure E so that, where possible, it essentially hugs the axis B', taking the form of a small tube (e.g. of the order of 1 cm in diameter) through which the employed electron beam passes, but widening out to accommodate structures such as the source 4, sample holder H, screen 26, camera 30, recorder 32, spectroscopic apparatus 34, etc.

The present disclosure relates to a method of using a charged particle microscope M, such as described by way of example by means of FIG. 1, in a scanning transmission mode for examining a sample S. Thus, the method as defined herein may be practised on a STEM. Alternatively, the method may be practised on an SEM as well.

The STEM M as shown and discussed with reference to FIG. 1 comprises at least a charged particle beam source 4 for emitting a charged particle beam B; a sample holder H for holding a sample S; an illuminator 6 for directing the charged particle beam B emitted from the charged particle source 4 on said sample S; a scanning unit D for scanning said beam B onto a plurality of sample locations on said sample S; and a control unit C for controlling operations of the scanning transmission charged particle microscope. The STEM as shown here is arranged for performing the method as defined herein, which will be explained below.

Figure 2:
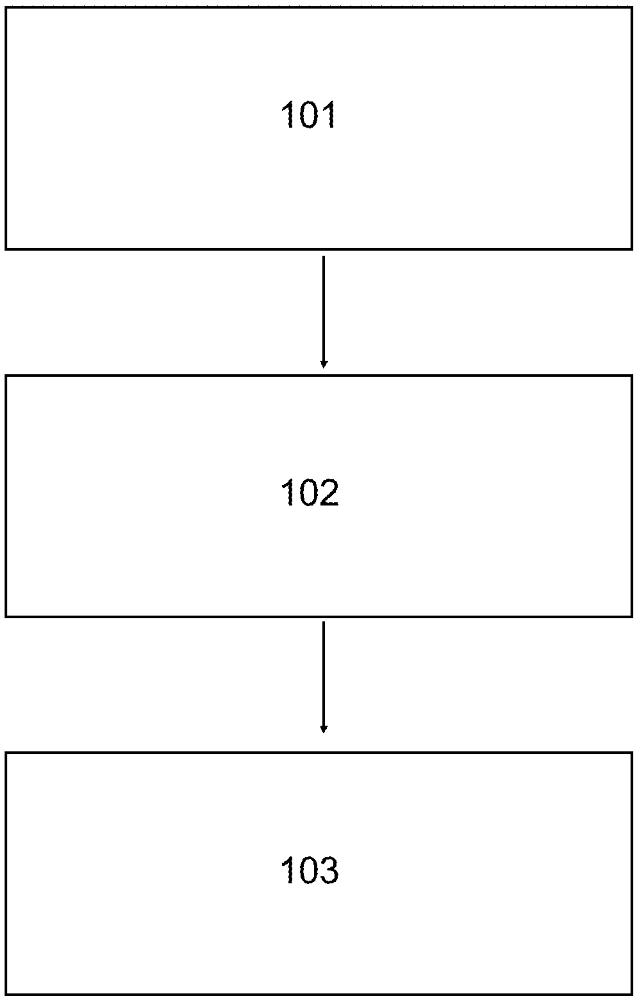
FIG. 2 shows a schematic overview of the method as defined herein.

Now turning to FIG. 2, a schematic block diagram of the method as defined herein is shown. The method as defined herein comprises the steps of providing 101 a scanning transmission charged particle microscope M; providing 102 a desired dose for at least a first sample location of said plurality of sample locations; and determining 103, using the controller C of the scanning transmission charged particle microscope, a first set of parameter settings for said illuminator 6 and said scanning unit D for substantially achieving said desired dose at said first sample location.

By providing dose controlled sample examination, wherein a desired dose is provided and a controller is used for providing settings that effectuate that desired dose, a more reproducible examination is possible. This is not only true for experiments performed on the same microscope M, but also true for experiments between different microscopes.

The desired dose in step 102 may be directly provided by means of a user. For example, it is conceivable that a user interface is used that allows the user to enter the desired dose directly. It is also conceivable that the user indicates a type of sample to be studied, and that the controller C is used to determine a desired dose based on the sample information given by said user. Other direct or indirect ways of providing a desired dose are conceivable as well.

Figure 3:
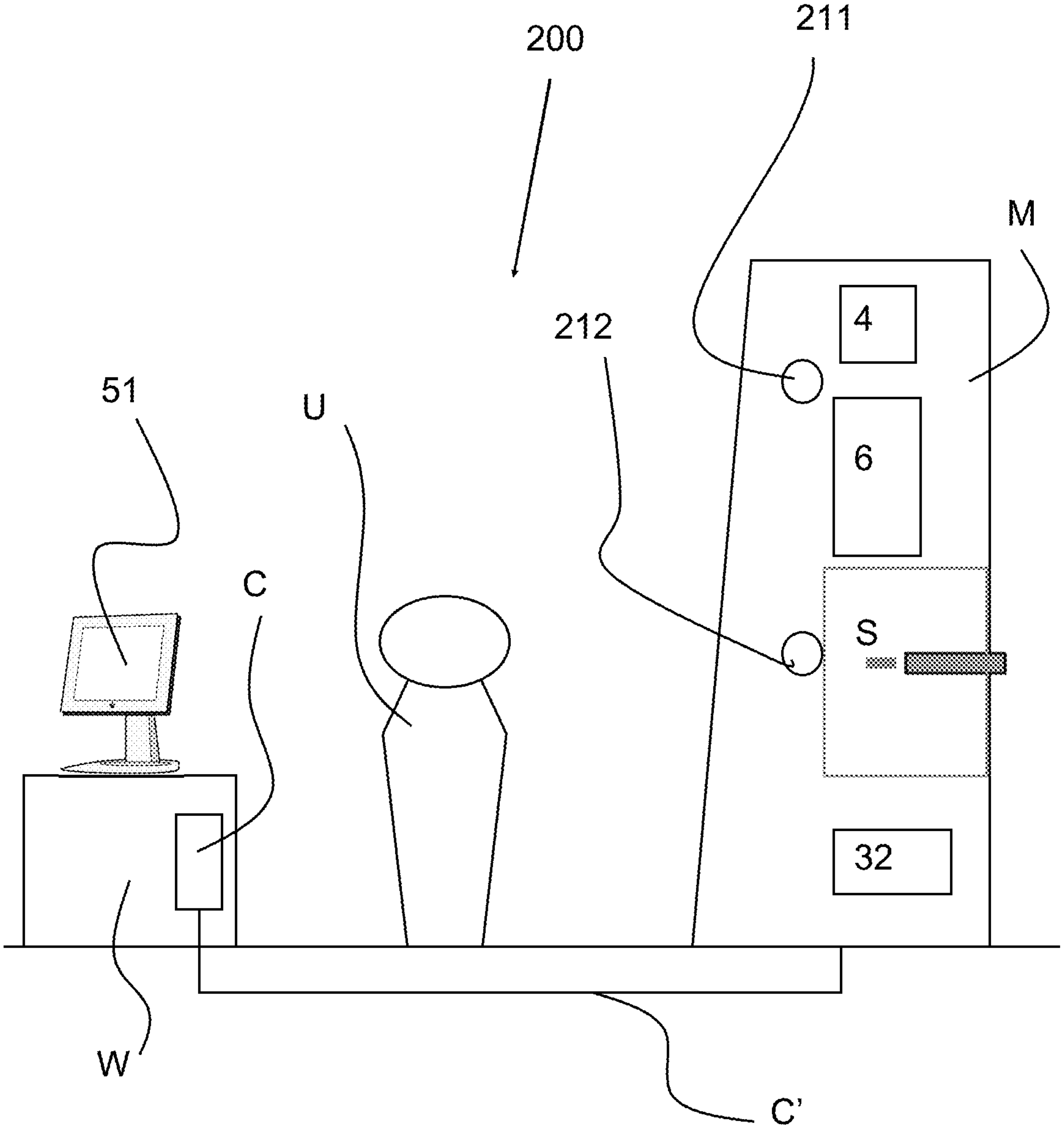
FIG. 3 shows a schematical overview of a microscope as defined herein.

FIG. 3 shows a schematical setup of the microscope M as defined herein. Here, the microscope M defines a system 200 that includes a workstation W with a User Interface provided on a computer screen 51, and wherein the workstation W comprises at least part of the controller C embedded therein. Other parts of the controller (not shown) could be part of the microscope M itself, or can be placed external thereof. As indicated in FIG. 1, the controller C is connected to the various parts of the microscope by means of controller lines C'. For reasons of clarity, the microscope M is schematically shown here, with the source 4, the illuminator 6, the sample S on the sample holder H, and the STEM recorder 32. Note that the detector 32 can in principle be any desired detector that is suitable for being used in scanning transmission charged particle microscopy. In some embodiments the detector 32 can be any desired detector suitable for charged particle microscopy in non-transmission applications.

In the system 200 shown in FIG. 3, the user U can enter the desired dose on the workstation W, using the graphical user interface provided on the computer screen 51, for example. The controller C will use the provided desired dose, and will determine a first set of parameter settings for said illuminator 6 and said scanning unit D for substantially achieving said desired dose at said first sample S location.

As indicated before, there are three main principles that can be used by the controller, either alone or in any combination, for determining the settings of the scanning transmission charged particle microscope:

1) using a numerical model to calculate the settings of the microscope based on the desired dose as an input parameter;
2) using active measurements of the beam current and modifying settings of the microscope based on the desired dose as an input parameter; and
3) using calibration data of the microscope to determine the settings of the microscope based on the desired dose as an input parameter.

For reasons of conciseness, these principles will not be repeated here.

With reference to FIG. 3 and the above principles, it will be added that the numerical model can be part of the controller C, for example in the form of a software module, or can be connected thereto. For example, the numerical model can be part of a separate processor that is part of the workstation W. Other embodiments are conceivable as well.

Further, the microscope M may comprise at least one beam current measurement device 211, 212. The beam current measurement device 211 may be positioned downstream of the source 4, and upstream of the illuminator 6, and may be arranged for measuring the beam current at an extractor aperture of the source 4. The beam current measurement device 212 may be positioned downstream of the illuminator 6, and may be arranged for measuring the beam current at the location of the sample S. These beam current measurement devices 211, 212 may be used for active measurements of the beam current, which can be used by the controller C for modifying the settings of the microscope M based on these measurements and the desired dose setting.

The system 200 may further comprise calibration data of the microscope M, which calibration data may be stored as software data in the workstation W, or the microscope M itself.

Figure 4:
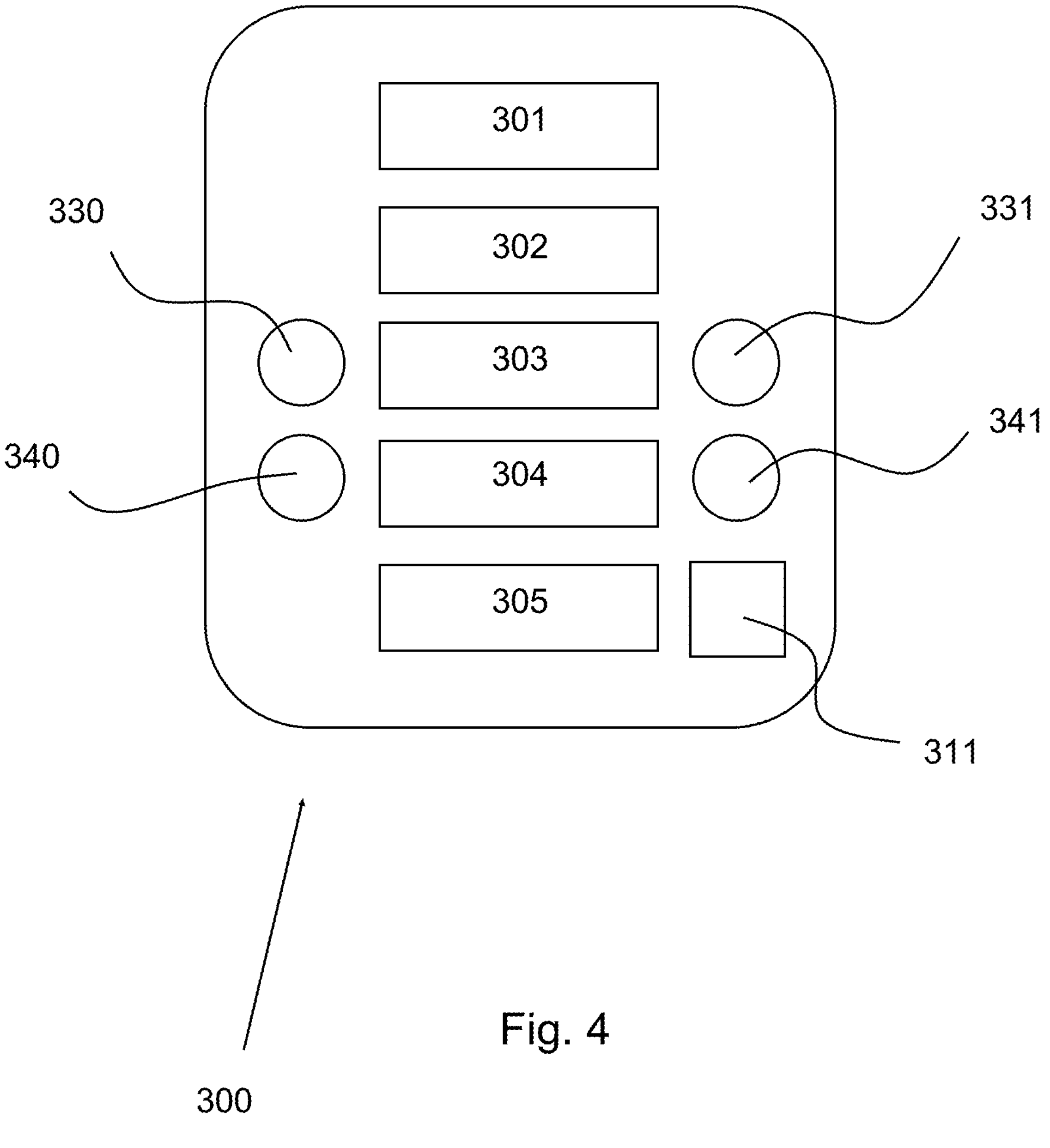
FIG. 4 shows a schematical embodiment of a (graphical) user interface that can be used in the microscope as defined herein.

Now turning to FIG. 4, a part of the user interface (UI) 300 for providing the desired dose is shown. With the above mentioned method for controlling the illuminator and/or deflectors for obtaining a desired dose, the dose can be provided by means of this UI. The UI shown comprises an optimize probe button 301, a calibrate button 302, a dose rate display 303, a dose display 304, a total dose display 305, a plus button 331 and minus button 330 for modifying the dose rate, a plus button 341 and minus button 340 for modifying the dose, and a reset button 311 for resetting the displayed total dose 305.

The calibrate button 302 can be used to calibrate the beam current that is currently provided to the illuminator 6, as described above. The dose rate 303 can be calculated, for example, from the optical model (i.e. numerical model) and will be displayed in the UI 300. In case a sample S shows beam-induced damage the user U can press the minus button 330 to decrease the dose-rate. In case there is no damage, the end-user can press the plus buttion 331 to increase the dose-rate and improve the signal to noise. This enables the customers to find optimum settings in total dose and dose rate for the experiment at hand in STEM.

In an embodiment, the method comprises the step of providing the acquisition parameters, which acquisition parameters include pixel dwell time, pixel size, and scan field of view, for example. With these acquisition parameters it is possible to calculate the the dose per Å squared for one acquired image can be calculated. The end-user can adjust the dose 304 by pressing the plus button 341 or the minus buttion 340. In this case, not only the settings of the illuminator can be optimized but also optimization of pixel dwell time can be taken into account.

The total dose 305 displayed is the cumulative dose adding up the dose of all acquisitions on the same area. Here the user may be informed for his material how many images can be taken with a certain dose and dose rate before the sample S shows cumulative damage. The reset button 311 can be used to reset the total dose 305 back to zero.

In an embodiment, parameters used in the experiment are stored in the metadata of the experimental data set, which allows to reproduce old results via this documentation. Moreover every area scanned should be stored in the metadata as well so that multiple exposures of the same area are documented and can be avoided by the operator.

In an embodiment, the calibration of the UI can be handled via STEM detectors. The BF detector such as used in NGSTEM is well suited for a beam current measurement. The advantage is that one can maintain the microscope in the HRSTEM setting: There is no need to go out of diffraction and to center a small probe into a Faraday cup which is mostly outside the field of view of a camera and therefore requires shifting the beam which potentially might impact the aberrations. In a work flow, one can move the stage to a hole area on the specimen so that the beam current can be accurately determined. This can be used as input for the dose rate calibration as shown in FIG. 4.

To minimize the accumulated dose on the area of interest, the beam can be moved away from this area with the beam shift deflectors D. In principle beam shifts on probe corrected microscopes are performed with the "pivot point" at the coma-free plane of the objective lens. In this way, it is possible to minimize scan coma. However, large beam shifts also create parasitic astigmatism. In our low-dose HRSTEM workflow proposal, we add beam-shift dependent stigmator corrections so that the astigmatism stays perfectly corrected when creating beam shifts. In principle, similar beam-shift dependent corrections can be made for coma. This can be added to the UI of FIG. 4 by adding an "Optimize Probe" button 301 to shift the beam and optimize the optical performance (for example by running an algorithm like OptiSTEM to focus and correct astigmatism and coma of the probe), so that for extreme beam sensitive materials only one scan is required on the area of interest, because all optimization steps are performed on another area.

In an example, the method and microscope as defined herein can be used in the following method:

1) Optimize optical performance (like correction of astigmatism and coma) at specimen area A;
2) Move to specimen area B using beam shift (or stage) and maintain optical performance;
3) Optimize dose(-rate) on specimen area B via calibrated and reproducible dose(-rate) control;
4) If needed change High Tension on the fly and repeat previous steps;
5) Move to specimen area C to make final HRSTEM acquisitions at optimized dose(-rate);
6) Keep track of total accumulated dose;
7) If total accumulated dose exceeds a certain boundary, move to specimen area D, or make make HRSTEM acquisitions on e.g. a pattern of N×N beam shifts;

8) Store all settings in meta data of image set so that experiments can be later repeated under exactly similar dose-rate or dose settings.

In other examples, the method and microscope as defined herein may be used in acquiring an image, wherein the dose and/or dose rate are determined by a numerical model (optical model) and indicated to a user during the experiment (i.e. "live"). One or more of the following options then may apply:

a) If damage is occurring, the acceleration voltage (HT) may be changed to keep the dose and/or dose rate the same, wherein use is made of the numerical model. A further image may be acquired to see if the damage disappeared. If so, then the Knock on damage is fixed.
b) If damage is occurring, the dose and/or dose rate may be changed and a further image may be acquired to see if the damage disappeared. If so, then the radiolysis/temperature effects are fixed.
c) If no damage occurs, then the acceleration voltage (HT) may be increased whilst keeping the dose and/or dose rate the same to improve optical performance. A further image may be acquired again to see if sample is still stable.
d) If no damage occurs, then the dose and/or dose rate may be increased to improve S/N of image. A further image may be acquired again to see if sample is still stable.

e) Go to diffraction to orientated sample using stage a,b, measure total dose during the orientation to indicate how much dose and which dose rate was used to come to good acquisition conditions. Switch back to S/TEM mode to record data. Store afterwards total dose of workflow, total dose of final result and dose rate for documentation and reproducibility of experiment on other area or other sample.
f) Search for feature of interest by moving the stage and readout the camera or STEM image to find feature continuously. Mark areas illuminated in a map storing the areas (and images) exposed and the dose/dose rate used on the areas. This gives an overview of where the sample has been already exposed and avoids double visit of same area already burned before.
g) Change magnification to examined finer feature and keep dose and dose rate the same by adapting the illuminator automatically to keep them constant.
h) Change sampling in STEM (change in resolution, for example 512×512 to 1024×1024) and keep dose and dose rate the same by adapting the illuminator automatically.
i) Change probe size to increase resolution and keep dose and dose rate the same using the numerical model of the illuminator.
j) Blank the beam in each of the workflows a-i above after exposing the sample to minimize total dose applied and avoid drilling holes in the sample if scan has stopped and beam stays on one area.

It is noted that the invention could be practised in principle also in non-transmission charged particle microscopes. In that case the step, as defined herein, of providing a scanning transmission charged particle microscope will be replaced by the step of providing a scanning charged particle microscope, in particular of the non-transmission type. This modification of replacing the transmission charged particle microscope with a non-transmission charged particle microscope may be applied to all embodiments disclosed herein.

It is furthermore noted that the invention could also be practised in principle also in non-scanning transmission charged particle microscopes, such as a TEM. In this case, a numerical model (optical model) could be used as well. The dose and dose rate could be setup in TEM using the model of the illuminator in the same way as with STEM mode. In TEM, no scanning unit is used, and thus the first set of parameters as defined herein only include settings for the illuminator. In TEM, it will be possible to use the exposure time of the camera to control the dose-rate, and additionally the total illuminated area of the defocused beam can be predicted. Using a numerical model in TEM to predict dose/dose rate can be very useful, in particular for life science applications, for example.

The invention claimed is:

1. A method for examining a sample in a scanning transmission charged particle microscope, comprising the steps of:

providing a scanning transmission charged particle microscope, said scanning transmission charged particle microscope comprising:
- a charged particle beam source for emitting a charged particle beam;
- a sample holder for holding a sample;
- an illuminator for directing the charged particle beam emitted from the charged particle source on said sample;
- a scanning unit for scanning said beam onto a plurality of sample locations on said sample; and a controller for controlling operations of the scanning transmission charged particle microscope;

characterized by providing a desired dose parameter for at least a first sample location of said plurality of sample locations;

determining, using said controller, a first set of parameter settings for said illuminator and said scanning unit for substantially achieving said desired dose parameter at said first sample location, wherein said first set of parameter settings are determined using a numerical model based on the desired dose parameter, wherein the first parameter settings for said illuminator includes settings for a condenser lens of the illuminator, and the desired dose parameter includes a desired dose rate; and providing a second desired dose parameter and determining, using said controller, a second set of parameter settings for said illuminator and said scanning unit for substantially achieving said second desired dose parameter, wherein determining the second set of parameter settings for said illuminator includes measuring a beam current upstream of the illuminator, and determining the second set of parameter settings using the numerical model, wherein the measured beam current and the second desired dose parameter are the input parameters of the numerical model.

2. Method according to claim 1, further comprising the step of illuminating said sample at said first location using said first set of parameter settings.

3. Method according to claim 1, wherein said sample is illuminated at said first location using said second set of parameter settings.

4. Method according to claim 1, wherein said sample is illuminated at a second location of said plurality of sample locations using said first set of parameter settings.

5. Method according to claim 1, comprising the step of tracking an accumulated dose effect for said corresponding location.

6. Method according to claims 1, wherein said charged particle microscope comprises a user interface, wherein said user interface allows a user to provide input settings for said desired dose parameter.

7. Method according to claim 6, wherein said desired dose parameter include a dose parameter, including at least one of a dose rate, a dose, and a total dose.

8. Method according to claim 1, comprising the step of changing an acceleration voltage of the scanning transmission charged particle microscope, and determining, using said controller, a resulting dose and/or dose rate.

9. Method according to claim 1, comprising the step of providing a further scanning transmission charged particle microscope, and determining, using a respective controller of said further scanning transmission charged particle microscope, a respective first set of parameter settings for said further scanning transmission charged particle microscope for substantially achieving said desired dose parameter.

10. The method of claim 1, wherein the numerical model determines the first set of parameter settings based further on a beam current.

11. The method of claim 1, wherein the controller further characterized by: before determining the first set of parameter settings for said illuminator and said scanning unit, correcting astigmatism and coma at a sample location different from the first sample location, and wherein the numerical model comprises an aberration and a focus as part of set of parameters and first set of parameter settings keep the astigmatism and coma the same as the corrected astigmatism and coma.

12. The method of claim 1, wherein the numerical model comprises an aberration and a focus as part of set of parameters, and the focus, an astigmatism and/or coma are not changed when the first desired dose parameter changes to the second desired dose parameter.

13. Scanning transmission charged particle microscope, comprising:

a charged particle beam source for emitting a charged particle beam;

a sample holder for holding a sample;

an illuminator for directing the charged particle beam emitted from the charged particle source onto the sample; and a controller for controlling operations of the scanning transmission charged particle microscope;

characterized in that said scanning transmission charged particle microscope is arranged for:

receiving a desired dose parameter for at least a first sample location of said plurality of sample locations; and determining, using said controller, a first set of parameter settings for said illuminator for substantially achieving said desired dose parameter at said first sample location, wherein said first set of parameter settings are determined using a numerical model based on the desired dose parameter, wherein the first parameter settings for said illuminator includes settings for a condenser lens of the illuminator, and the desired dose parameter includes a desired dose rate; and providing a second desired dose parameter and determining, using said controller, a second set of parameter settings for said illuminator and said scanning unit for substantially achieving said second desired dose parameter, wherein determining the second set of parameter settings for said illuminator includes measuring a beam current upstream of the illuminator, and determining the second set of parameter settings using the numerical model, wherein the measured beam current and the second desired dose parameter are the input parameters of the numerical model.

14. Scanning transmission charged particle microscope according to claim 13, comprising a user interface, wherein said user interface allows a user to provide input settings for said desired dose parameter, wherein said desired dose parameter comprises one or more from the list consisting of a dose rate, a dose, and a total dose.

15. Scanning transmission charged particle microscope according to claim 13, further comprising a scanning unit for scanning said beam onto a plurality of sample locations on said sample; and wherein the first set of parameter settings include settings for the scanning unit.

16. Scanning transmission charged particle microscope according to claim 13, wherein said scanning transmission charged particle microscope is further arranged for determining said first set of parameter settings for said illuminator without pre-exposing the sample to the charged particle beam.

* * * * *